United States Patent
Darabnia et al.

(10) Patent No.: US 8,262,287 B2
(45) Date of Patent: Sep. 11, 2012

(54) THERMOCOUPLE

(75) Inventors: Buz Darabnia, Gilbert, AZ (US); Andy Yednak, Phoenix, AZ (US); Mike Halpin, Scottsdale, AZ (US); Loren Jacobs, Chandler, AZ (US); Ravinder Aggarwal, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 575 days.

(21) Appl. No.: 12/330,096

(22) Filed: Dec. 8, 2008

(65) Prior Publication Data
US 2010/0145547 A1     Jun. 10, 2010

(51) Int. Cl.
G05D 23/00 (2006.01)
G01K 7/02 (2006.01)
(52) U.S. Cl. ............. 374/179; 374/208; 374/E07.004
(58) Field of Classification Search .......... 374/178, 374/179, 208, E7.004
See application file for complete search history.

(56) References Cited

U.S. PATENT DOCUMENTS

| | | |
|---|---|---|
| 154,695 A | 9/1874 | Manly |
| 2,059,480 A | 11/1936 | Obermaier |
| 2,266,416 A | 12/1941 | Duclos |
| 2,563,931 A | 8/1951 | Harrison |
| 2,660,061 A | 11/1953 | Lewis |
| 3,011,006 A | 11/1961 | Nicholson |
| 3,038,951 A | 6/1962 | Mead |
| 3,263,502 A | 8/1966 | Springfield |
| 3,588,192 A | 6/1971 | Drutchas et al. |
| 3,867,205 A | 2/1975 | Schley |
| 3,913,058 A | 10/1975 | Nishio et al. |
| 4,093,491 A | 6/1978 | Whelpton et al. |
| 4,217,463 A | 8/1980 | Swearingen |
| 4,234,449 A | 11/1980 | Wolson et al. |
| 4,355,912 A | 10/1982 | Haak |
| 4,377,347 A | 3/1983 | Hanmyo et al. |
| 4,444,990 A | 4/1984 | Villar |
| 4,454,370 A | 6/1984 | Voznick |
| 4,527,005 A | 7/1985 | McKelvey |
| 4,592,307 A | 6/1986 | Jolly |
| 4,692,556 A | 9/1987 | Bollen et al. |
| 4,721,533 A | 1/1988 | Phillippi et al. |

(Continued)

FOREIGN PATENT DOCUMENTS

CN 1815155 8/2006

(Continued)

OTHER PUBLICATIONS

International Search Report and Written Opinion for Application No. PCT/US2010/033252 dated Jan. 28, 2011.

(Continued)

*Primary Examiner* — Yaritza Guadalupe-McCall
(74) *Attorney, Agent, or Firm* — Snell & Wilmer L.L.P.

(57) ABSTRACT

A thermocouple for use in a semiconductor processing reaction is described. The thermocouple includes a sheath having a measuring tip and an opening at the opposing end. A support member that receives a portion of a first wire and a second wire is received within the sheath. The first and second wires form a junction that contacts the inner surface of the sheath at the measuring tip. A spacing member is secured at the opening of the sheath and receives the support member. The spacing member allows the support member, first wire, and second wire to freely thermally expand relative to each other without introducing compression or tension stresses therein.

22 Claims, 9 Drawing Sheets

U.S. PATENT DOCUMENTS

| | | | |
|---|---|---|---|
| 4,721,534 | A | 1/1988 | Phillippi et al. |
| 4,749,416 | A | 6/1988 | Greenspan |
| 4,830,515 | A | 5/1989 | Cortes |
| 4,934,831 | A | 6/1990 | Volbrecht |
| 4,976,996 | A | 12/1990 | Monkowski et al. |
| 4,978,567 | A | 12/1990 | Miller |
| 4,984,904 | A | 1/1991 | Nakano et al. |
| 4,989,992 | A | 2/1991 | Piai |
| 5,027,746 | A | 7/1991 | Frijlink |
| 5,065,698 | A | 11/1991 | Koike |
| 5,071,258 | A | 12/1991 | Usher et al. |
| 5,104,514 | A | 4/1992 | Quartarone |
| 5,108,192 | A | 4/1992 | Mailliet et al. |
| 5,158,128 | A | 10/1992 | Inoue et al. |
| 5,181,779 | A | 1/1993 | Shia et al. |
| 5,246,500 | A | 9/1993 | Samata et al. |
| 5,271,967 | A | 12/1993 | Kramer et al. |
| 5,294,778 | A | 3/1994 | Carman et al. |
| 5,315,092 | A | 5/1994 | Takahashi et al. |
| 5,336,327 | A | 8/1994 | Lee |
| 5,360,269 | A | 11/1994 | Ogawa et al. |
| 5,374,315 | A | 12/1994 | deBoer et al. |
| 5,421,893 | A | 6/1995 | Perlov |
| 5,456,761 | A | 10/1995 | Auger et al. |
| 5,474,618 | A | 12/1995 | Allaire |
| 5,493,987 | A | 2/1996 | McDiarmid et al. |
| 5,514,439 | A | 5/1996 | Sibley |
| 5,527,111 | A | 6/1996 | Lysen et al. |
| 5,562,774 | A | 10/1996 | Breidenbach et al. |
| 5,571,333 | A | 11/1996 | Kanaya |
| 5,611,265 | A | 3/1997 | Ronci et al. |
| 5,697,706 | A | 12/1997 | Ciaravino et al. |
| 5,716,133 | A | 2/1998 | Hosokawa et al. |
| 5,753,835 | A | 5/1998 | Gustin |
| 5,756,835 | A | 5/1998 | Bowden |
| 5,788,799 | A | 8/1998 | Steger et al. |
| 5,791,782 | A | 8/1998 | Wooten et al. |
| 5,806,980 | A | 9/1998 | Berrian |
| 5,902,407 | A | 5/1999 | deBoer et al. |
| 5,904,778 | A | 5/1999 | Lu et al. |
| 5,910,221 | A | 6/1999 | Wu |
| 6,056,823 | A | 5/2000 | Sajoto et al. |
| 6,066,209 | A | 5/2000 | Sajoto et al. |
| 6,102,565 | A | 8/2000 | Kita et al. |
| 6,120,640 | A | 9/2000 | Shih et al. |
| 6,121,061 | A | 9/2000 | Van Bilsen et al. |
| 6,129,808 | A | 10/2000 | Wicker et al. |
| 6,170,429 | B1 | 1/2001 | Schoepp et al. |
| 6,227,140 | B1 | 5/2001 | Kennedy |
| 6,235,858 | B1 | 5/2001 | Swarup et al. |
| 6,243,654 | B1 | 6/2001 | Johnson et al. |
| 6,257,758 | B1 | 7/2001 | Culbertson |
| 6,325,858 | B1 | 12/2001 | Wengert et al. |
| 6,342,691 | B1 | 1/2002 | Johnsgard et al. |
| 6,580,050 | B1 | 6/2003 | Miller et al. |
| 6,676,290 | B1 | 1/2004 | Lu |
| 7,008,802 | B2 | 3/2006 | Lu |
| 7,090,394 | B2 | 8/2006 | Hashikura et al. |
| 7,166,165 | B2 | 1/2007 | Halpin |
| 7,274,867 | B2 | 9/2007 | Peukert |
| 7,651,269 | B2 | 1/2010 | Comendant |
| 7,789,559 | B2 | 9/2010 | Waser et al. |
| 7,871,198 | B2* | 1/2011 | Rempe et al. ............... 374/179 |
| 7,874,726 | B2* | 1/2011 | Jacobs et al. ............... 374/179 |
| 7,946,762 | B2* | 5/2011 | Yednak, III .................. 374/179 |
| 8,046,193 | B2 | 10/2011 | Yetter et al. |
| 8,100,583 | B2* | 1/2012 | Conner et al. ............... 374/179 |
| 2002/0011211 | A1 | 1/2002 | Halpin |
| 2002/0043337 | A1 | 4/2002 | Goodman et al. |
| 2003/0002562 | A1 | 1/2003 | Yerlikaya et al. |
| 2003/0035905 | A1 | 2/2003 | Lieberman et al. |
| 2003/0192435 | A1 | 10/2003 | McNair |
| 2005/0092733 | A1 | 5/2005 | Ito et al. |
| 2005/0101843 | A1 | 5/2005 | Quinn et al. |
| 2005/0141591 | A1 | 6/2005 | Sakano |
| 2006/0026314 | A1 | 2/2006 | Franchuk et al. |
| 2006/0275933 | A1 | 12/2006 | Du Bois et al. |
| 2007/0062439 | A1 | 3/2007 | Wada et al. |
| 2007/0258506 | A1 | 11/2007 | Schwagerman et al. |
| 2008/0043803 | A1 | 2/2008 | Bandoh |
| 2008/0205483 | A1* | 8/2008 | Rempe et al. ............... 374/179 |
| 2008/0228306 | A1 | 9/2008 | Yetter et al. |
| 2008/0289574 | A1* | 11/2008 | Jacobs et al. .................. 118/708 |
| 2009/0052498 | A1* | 2/2009 | Halpin et al. ................ 374/179 |
| 2009/0159000 | A1 | 6/2009 | Aggarwal et al. |
| 2009/0308425 | A1* | 12/2009 | Yednak, III ................... 136/230 |
| 2010/0145547 | A1* | 6/2010 | Darabnia et al. ............. 374/179 |
| 2010/0282163 | A1 | 11/2010 | Aggarwal et al. |

FOREIGN PATENT DOCUMENTS

| | | |
|---|---|---|
| EO | 0887632 | 12/1998 |
| EP | 0229488 | 7/1987 |
| EP | 0723141 | 7/1996 |
| FR | 1408266 | 8/1965 |
| GB | 0752277 | 7/1956 |
| JP | 5819462 | 4/1982 |
| JP | 02185038 | 7/1990 |
| JP | 05-023079 | 3/1993 |
| JP | 5-64627 | 3/1993 |
| JP | 05118928 | 5/1993 |
| JP | 09089676 | 4/1997 |
| JP | 10-153494 | 6/1998 |
| JP | 10-227703 | 8/1998 |
| JP | 11-118615 | 4/1999 |
| JP | 11-183264 | 7/1999 |
| JP | 11-183265 | 7/1999 |
| JP | 11-287715 | 10/1999 |
| JP | 2004113270 | 4/2004 |
| JP | 2005-172489 | 6/2005 |
| JP | 2006-090762 | 4/2006 |
| JP | 20060153706 | 6/2006 |
| KR | 10-2000-0031098 | 6/2000 |
| KR | 1020020086763 | 11/2002 |
| KR | 1020030092305 | 12/2003 |
| WO | 9531582 | 11/1995 |
| WO | 9706288 | 2/1997 |
| WO | 9923276 | 5/1999 |
| WO | 9923690 | 5/1999 |
| WO | 0111223 | 2/2001 |

OTHER PUBLICATIONS

Final Office Action for U.S. Appl. No. 12/140,809 dated Dec. 28, 2010.

Non-Final Office Action dated Mar. 15, 2011 for U.S. Appl. No. 12/193,924.

Notice of Allowance dated Mar. 17, 2011 for U.S. Appl. No. 12/140,809.

International Search Report and Written Opinion for International Application No. PCT/US2009/066377 dated Jul. 1, 2010.

International Preliminary Report on Patentability dated Jun. 23, 2011 in Application No. PCT/US2009/066377.

Non-Final Office Action for U.S. Appl. No. 12/121,085 dated Apr. 28, 2010.

International Search Report and Written Opinion for International Application No. PCT/US2010/033244 dated Jun. 29, 2010.

CN; Office Action dated Jul. 14, 2010 in Application No. 200880012927.X.

PCT; International Search Report and Written Opinion dated Jul. 29, 2010 in Application No. PCT/US2010/033248.

USPTO; Office Action dated Sep. 13, 2010 in U.S. Appl. No. 12/140,809.

Notice of Allowance dated Jul. 26, 2010 in U.S. Appl. No. 12/121,085.

Notice of Allowance dated Oct. 4, 2010 in U.S. Appl. No. 12/121,085.

Introduction to Materials Science for Engineers, 3rd Ed., James F. Schackelford, pp. 398, Macmillan Publishing Co. (1992).

Linke, J. and Vietzke, E., "Behavior of Boron Doped Graphites, Plasma Sprayed Boron Carbides and a-C/B H as Plasma Facing Material," J. Fusion Tech., V.20, pp. 228-231 (Sep. 1991).

Ponnekanti et al., "Failure Mechanisms of Anodized Aluminum Parts Used in Chemical Vapor Deposition Chambers," J. Vac. Sci. Technol. A 14(3) (May 1, 1996).

"Thermocouples for Silicon Process Technologies," Vulcan Electric Company brochure.

"Thermocouples for the Semiconductor Industry," Engelhard Corporation brochure (2004).

PCT Notification of Transmittal of the International Search Report and The Written Opinion of the International Searching Authority, or the Declaration, dated Aug. 21, 2008, for International App. No. PCT/US2008/063919.

PCT Notification of Transmittal of the International Search Report and The Written Opinion of the International Searching Authority, or the Declaration, dated Mar. 5, 2009 for International App. No. PCT/US2008/074063.

PCT Notification of Transmittal of the International Search Report and The Written Opinion of the International Searching Authority, or the Declaration, dated Nov. 27, 2009, for International App. No. PCT/US2009/043454.

Final Office Action dated Sep. 30, 2011 for U.S. Appl. No. 12/193,924.

Notice of Allowance for U.S. Appl. No. 12/436,315 dated Nov. 17, 2011.

IPRP for PCT/US2010/033244 dated Nov. 17, 2011.

IPRP for PCT/US2010/033248 dated Nov. 17, 2011.

IPRP for PCT/US2010/033252 dated Nov. 17, 2011.

Examination Report Dated May 26, 2011 for App. No. 09733043.5-2313.

Non-Final Office Action dated Aug. 3, 2011 for U.S. Appl. No. 12/436,300.

Non-Final Office Action dated Aug. 3, 2011 for U.S. Appl. No. 12/436,315.

Restriction Requirement for U.S. Appl. No. 12/436,306 dated Dec. 20, 2011.

Official Action for Japanese Patent Application 2010-522075 dated Dec. 20, 2011.

Final Office Action dated Jan. 23, 2012 for U.S. Appl. No. 12/436,300.

Non-Final Office Action dated Apr. 11, 2012 for U.S. Appl. No. 12/436,306.

Official Action for Japanese Patent Application 2010-522075 mailed on Apr. 13, 2012.

Non-Final Office Action dated May 22, 2012 in U.S. Appl. No. 12/436,300.

Advisory Action dated Mar. 6, 2012 for U.S. Appl. No. 12/436,300.

International Preliminary Report on Patentability for International Application No. PCT/US2008/074063 dated Mar. 4, 2010.

International Preliminary Report on Patentability for International Application No. PCT/US2010/033244 dated Dec. 29, 2010.

* cited by examiner

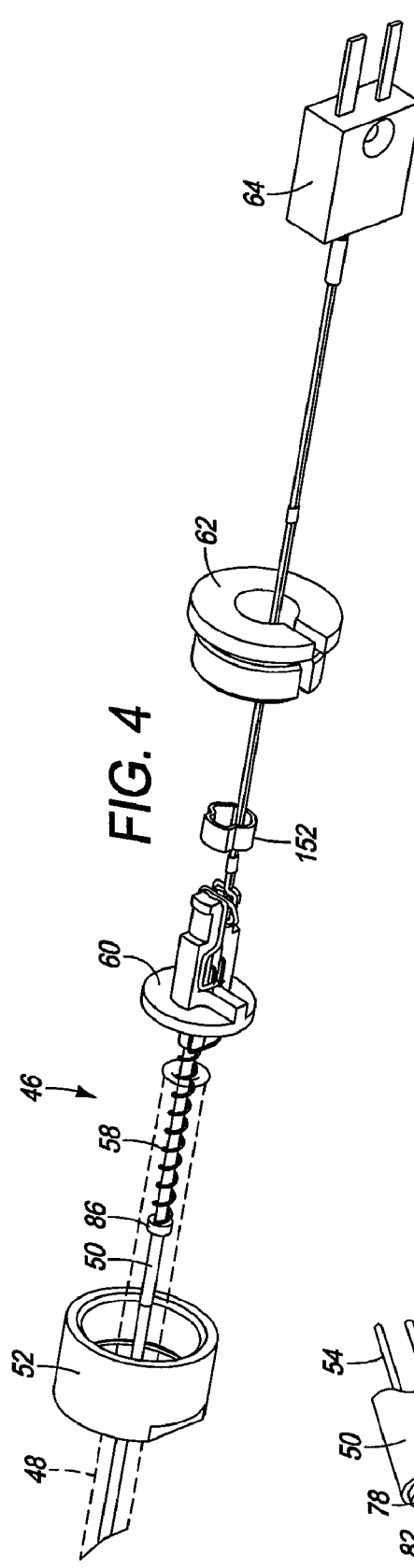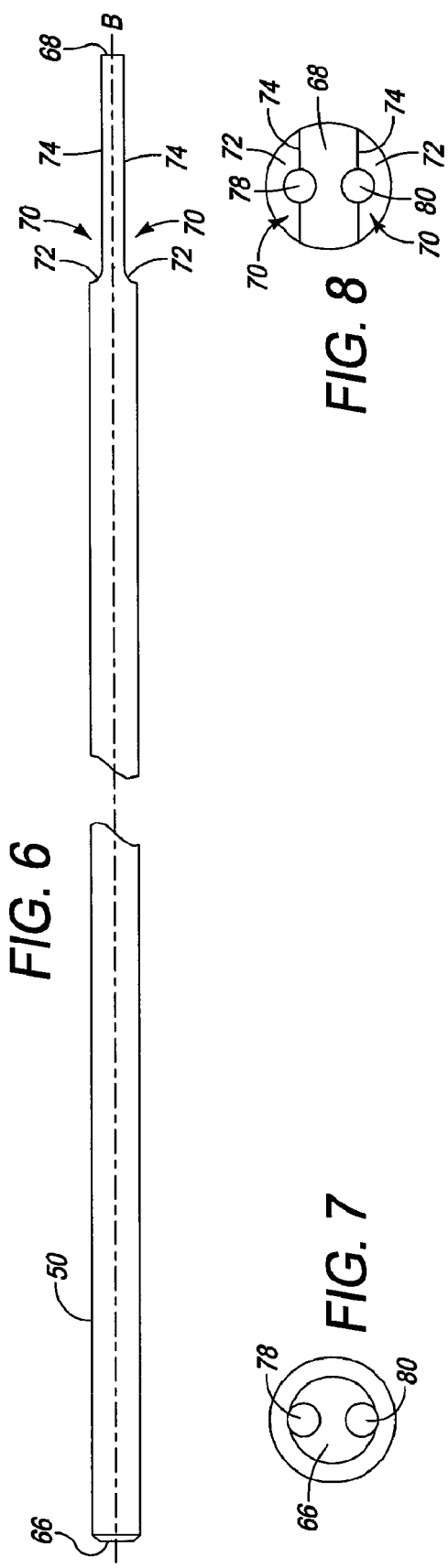

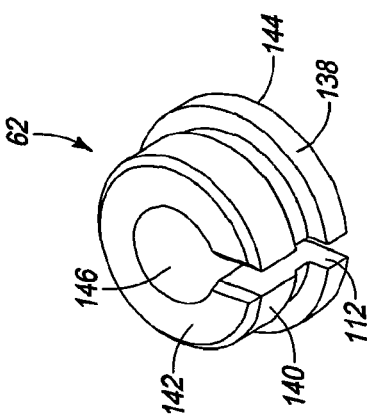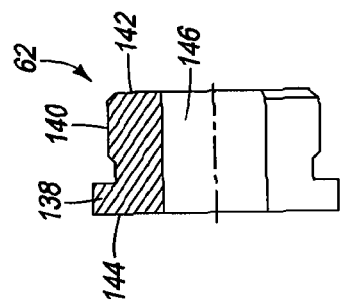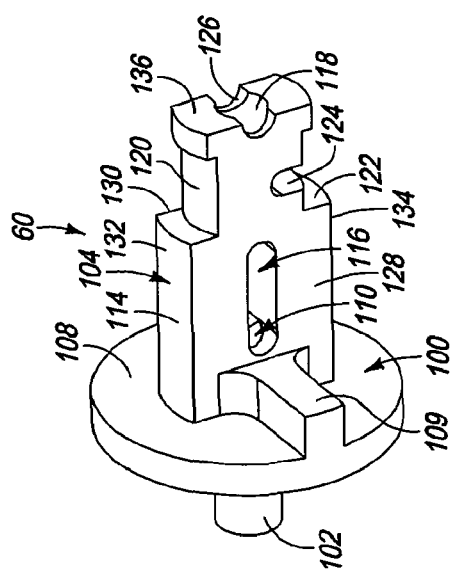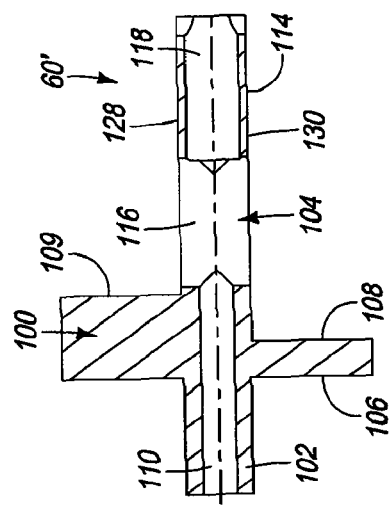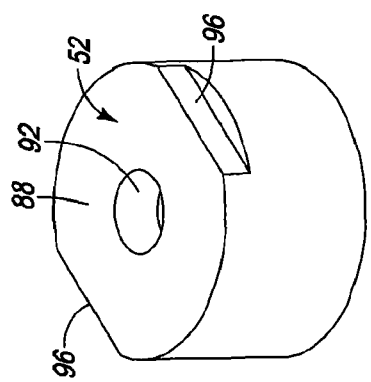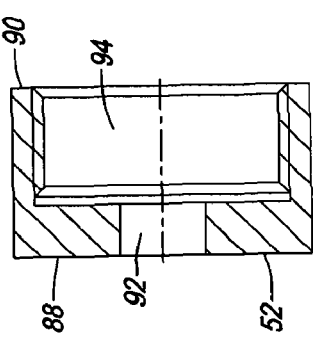

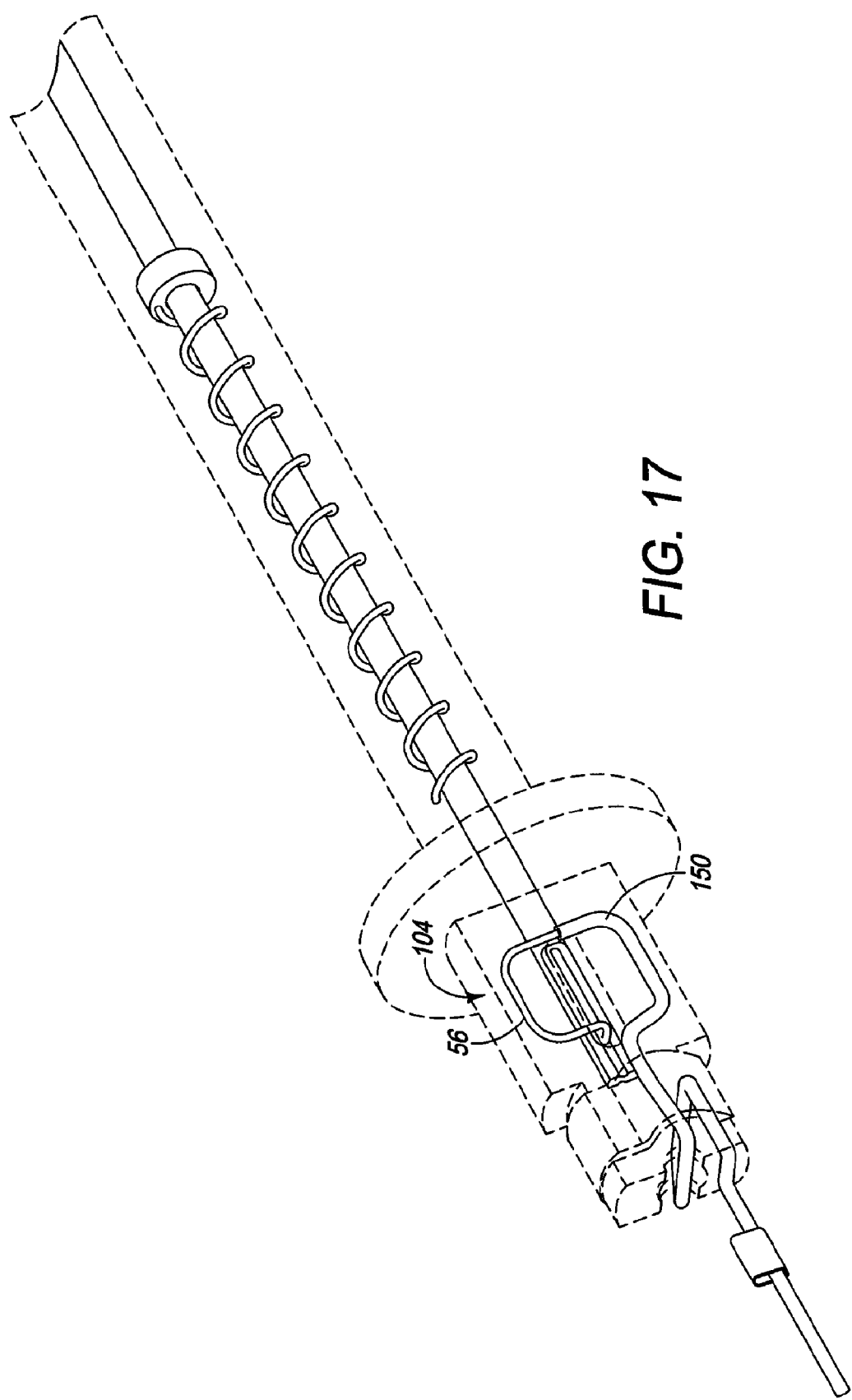

THERMOCOUPLE

FIELD OF THE INVENTION

The present invention relates to a temperature sensor, and more particularly to a temperature sensor configured to enhance accuracy of temperature control in a semiconductor processing apparatus.

BACKGROUND OF THE INVENTION

High-temperature semiconductor processing chambers are used for depositing various material layers onto a substrate surface or surfaces. One or more substrates or workpieces, such as silicon wafers, are placed on a workpiece support within the processing chamber. Both the substrate and workpiece support are heated to a desired temperature. In a typical processing step, reactant gases are passed over each heated substrate, whereby a chemical vapor deposition (CVD) reaction deposits a thin layer of the reactant material in the reactant gases on the substrate surface(s). Through subsequent processes, these layers are made into integrated circuits, and tens to thousands or even millions of integrated devices, depending on the size of the substrate and the complexity of the circuits.

Various process parameters must be carefully controlled to ensure the high quality of the resulting deposited layers. One such critical parameter is the temperature of the substrate during each processing step. During CVD, for example, the deposition gases react at particular temperatures to deposit the thin layer on the substrate. If the temperature varies greatly across the surface of the substrate, the deposited layer could be uneven which may result in unusable areas on the surface of the finished substrate. Accordingly, it is important that the substrate temperature be stable and uniform at the desired temperature before the reactant gases are introduced into the processing chamber.

Similarly, non-uniformity or instability of temperatures across a substrate during other thermal treatments can affect the uniformity of resulting structures on the surface of the substrate. Other processes for which temperature control can be critical include, but are not limited to, oxidation, nitridation, dopant diffusion, sputter depositions, photolithography, dry etching, plasma processes, and high temperature anneals.

Methods and systems are known for measuring the temperature at various locations near and immediately adjacent to the substrate being processed. Typically, thermocouples are disposed at various locations near the substrate being processed, and these thermocouples are operatively connected to a controller to assist in providing a more uniform temperature across the entire surface of the substrate. For example, U.S. Pat. No. 6,121,061 issued to Van Bilsen teaches a plurality of temperature sensors measuring the temperature at various points surrounding the substrate, including a thermocouple placed near the leading edge of the substrate, another near the trailing edge, one at a side, and another below the substrate near the center of the substrate.

However, thermocouples employed in measuring the temperature within the high-temperature processing chamber have been found to fail due to grain slip of the wires used in the thermocouple. The thermocouple typically includes an elongated ceramic member having longitudinal bores therewithin. A pair of wires extend the length of the bores, wherein one end of the wires are fused together and positioned adjacent to the substrate for temperature measurement purposes, and the opposing ends of the wires are connected to a controller. Typically, the ends of the wire opposite the temperature measuring ends exit the bores of the ceramic member and are secured to the sheath surrounding the ceramic member in a substantially fixed manner. When the deposition processing step is taking place, the processing reactor is heated, thereby heating the ceramic member and the wires of the thermocouple. When heated, the wires expand longitudinally at a different rate than the ceramic, thereby causing longitudinal stresses in the wires. Because both ends of the wires are substantially fixed, after repeated cycles of heating and cooling the longitudinal, compression or tension stresses within the wires cause grain slip within the wires resulting in failure of the thermocouple. Accordingly, a thermocouple design that allows the wires located within the ceramic member to expand more longitudinally relative to the longitudinal expansion of the ceramic member is needed.

BRIEF SUMMARY OF THE INVENTION

A need exists for a temperature sensing thermocouple that accommodates the different rates of thermal expansion of the support member relative to the wires received therein. In one aspect of the present invention, a thermocouple for measuring a temperature within a reaction chamber is provided. The thermocouple includes a sheath having a measuring tip and an opening. The thermocouple further includes a support member having a first distal end and an opposing a second distal end. A first wire is received within the support member, and a second wire is also received within the support member. The second wire is spaced-apart from the first wire within the support member. The thermocouple also includes a spacing member that receives the support member. The spacing member is attached to said sheath, wherein the spacing member allows the support member, the first wire, and the second wire to independently thermally expand.

In another aspect of the present invention, a temperature control system for use in a semiconductor processing reactor is provided. The temperature control system includes at least one heating element located within the reactor. The temperature control system further includes a controller operatively connected to the heating element(s), and the controller is configured to control the heating element(s). The temperature control system also includes at least one temperature sensor located within the reactor. The temperature sensor(s) is operatively connected to the controller for providing temperature data to the controller. The temperature sensor includes a thermocouple. The thermocouple is formed of a sheath having an opening. The thermocouple also includes a support member, and a portion of the support member is disposed within the sheath. The thermocouple includes a first wire and a second wire formed of dissimilar metals. A portion of the first and second wires are received within the support member. A spacing member is operatively connected to the sheath, wherein the spacing member receives the support member and the first and second wires. The spacing member allows the support member, the first wire, and the second wire to freely thermally expand at different rates without introducing compression or tension stresses therein.

Advantages of the present invention will become more apparent to those skilled in the art from the following description of the embodiments of the invention which have been shown and described by way of illustration. As will be realized, the invention is capable of other and different embodiments, and its details are capable of modification in various respects. Accordingly, the drawing(s) and description are to be regarded as illustrative in nature and not as restrictive.

BRIEF DESCRIPTION OF SEVERAL VIEWS OF THE DRAWINGS

FIG. 4 is an exploded view of a portion of the thermocouple of FIG. 3;

FIG. 5 is a magnified view of a bead junction;

FIG. 6 is a side view of an embodiment of a support member;

FIG. 7 is a first end view of the support member of FIG. 6;

FIG. 8 is a second end view of the support member of FIG. 6;

FIG. 12A is a top perspective view of a first retainer;

FIG. 12B is a cross-sectional view of the first retainer of FIG. 12A;

FIG. 13A is a top perspective view of an embodiment of a spacing member;

FIG. 13B is a cross-sectional view of the spacing member of FIG. 13A;

FIG. 14A is a top perspective view of a second retainer;

FIG. 14B is a cross-sectional view of the second retainer of FIG. 14A;

FIG. 17 is an embodiment of a wire pattern for a second wire about a spacing member.

DETAILED DESCRIPTION OF THE PREFERRED EMBODIMENT

Figure 1:
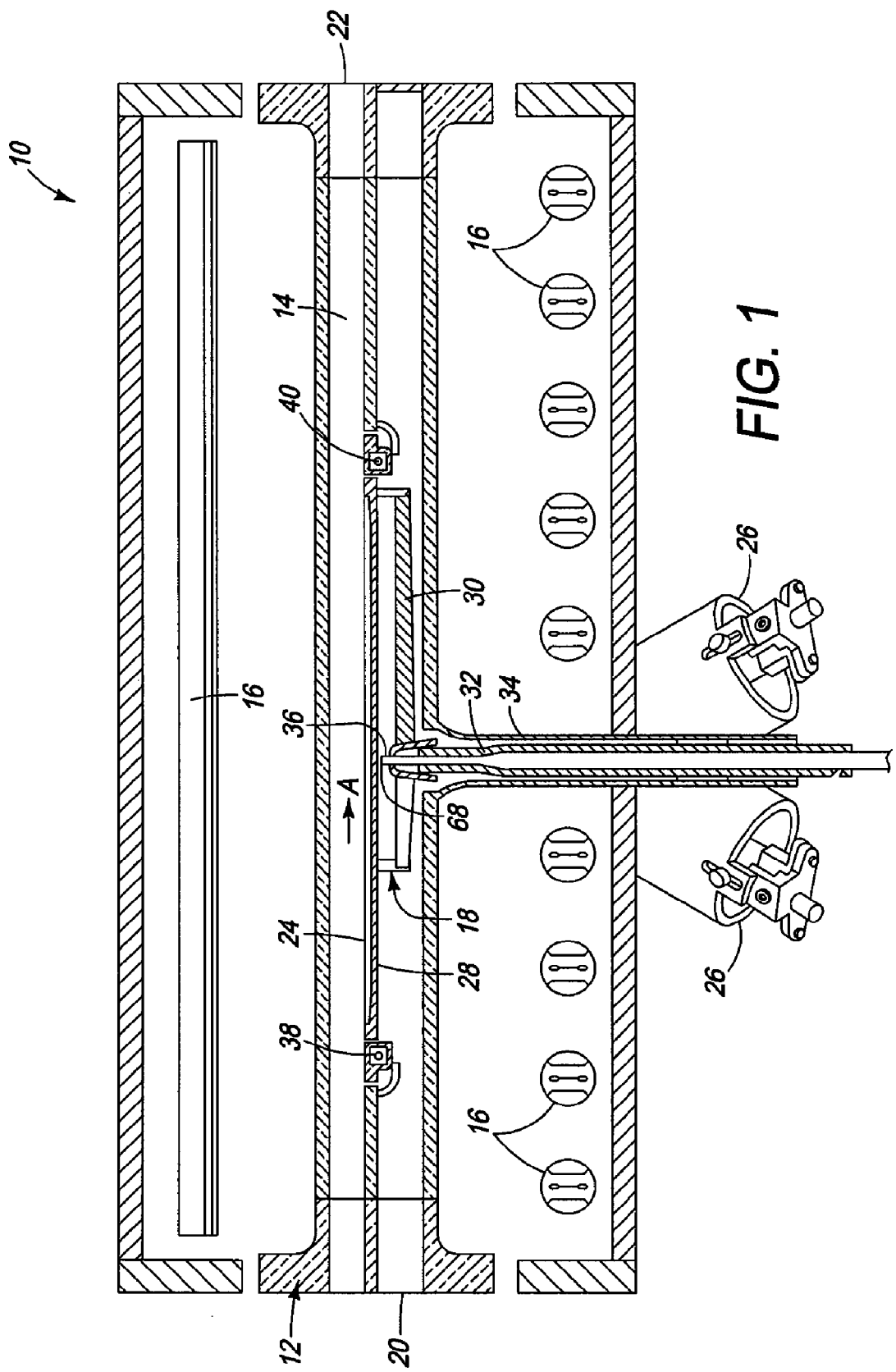
FIG. 1 is a cross-sectional view of an exemplary chemical vapor deposition reactor.

Referring to FIG. 1, an exemplary embodiment of a chemical vapor deposition ("CVD") reactor 10 is shown. While the illustrated embodiment is a single substrate, horizontal flow, cold-wall reactor, it should be understood by one skilled in the art that the thermocouple technology described herein may be used in other types of semiconductor processing reactors as well as other applications requiring accurate temperature sensors. The CVD reactor 10 includes a reaction chamber 12 defining a reaction space 14, heating elements 16 located on opposing sides of the reaction chamber 12, and a substrate support mechanism 18. The reaction chamber 12 is an elongated member having an inlet 20 for allowing reactant gases to flow into the reaction space 14 and an outlet 22 through which the reactant gases and process by-products exit the reaction space 14. In an embodiment, the reaction chamber 12 is formed of transparent quartz. It should be understood by one skilled in the art that the reaction chamber 12 may be formed of any other material sufficient to be substantially non-reactive relative to a deposition process therewithin.

The heating elements 16 form an upper bank and a lower bank, as shown in FIG. 1. The heating elements 16 are oriented in a spaced-apart manner relative to adjacent heating elements 16 within the same bank. In an embodiment, the heating elements 16 of the upper bank are oriented substantially perpendicular relative to the heating elements 16 of the lower bank. The heating elements 16 provide radiant energy to the reaction chamber 12 without appreciable absorption by the reaction chamber 12 walls. The heating elements 16 are configured to provide radiant heat to the substrate 24 being processed as well as portions of the substrate support mechanism 18. In an embodiment, a plurality of spot lamps 26 provide concentrated heat to the underside of the substrate support mechanism 18 to counteract a heat sink effect caused by cold support structures extending upwardly through the bottom wall of the reaction chamber 12.

The substrate support mechanism 18 includes a substrate holder 28, which receives the substrate 24, and a support spider 30, as shown in FIG. 1. The support spider 30 is connected to a shaft 32 that extends downwardly through a tube 34 depending from the lower wall of the reaction chamber 12. A motor (not shown) is configured to rotate the shaft 32, thereby rotating the substrate holder 28 and substrate 24 in a like manner during the deposition process.

Figure 2:
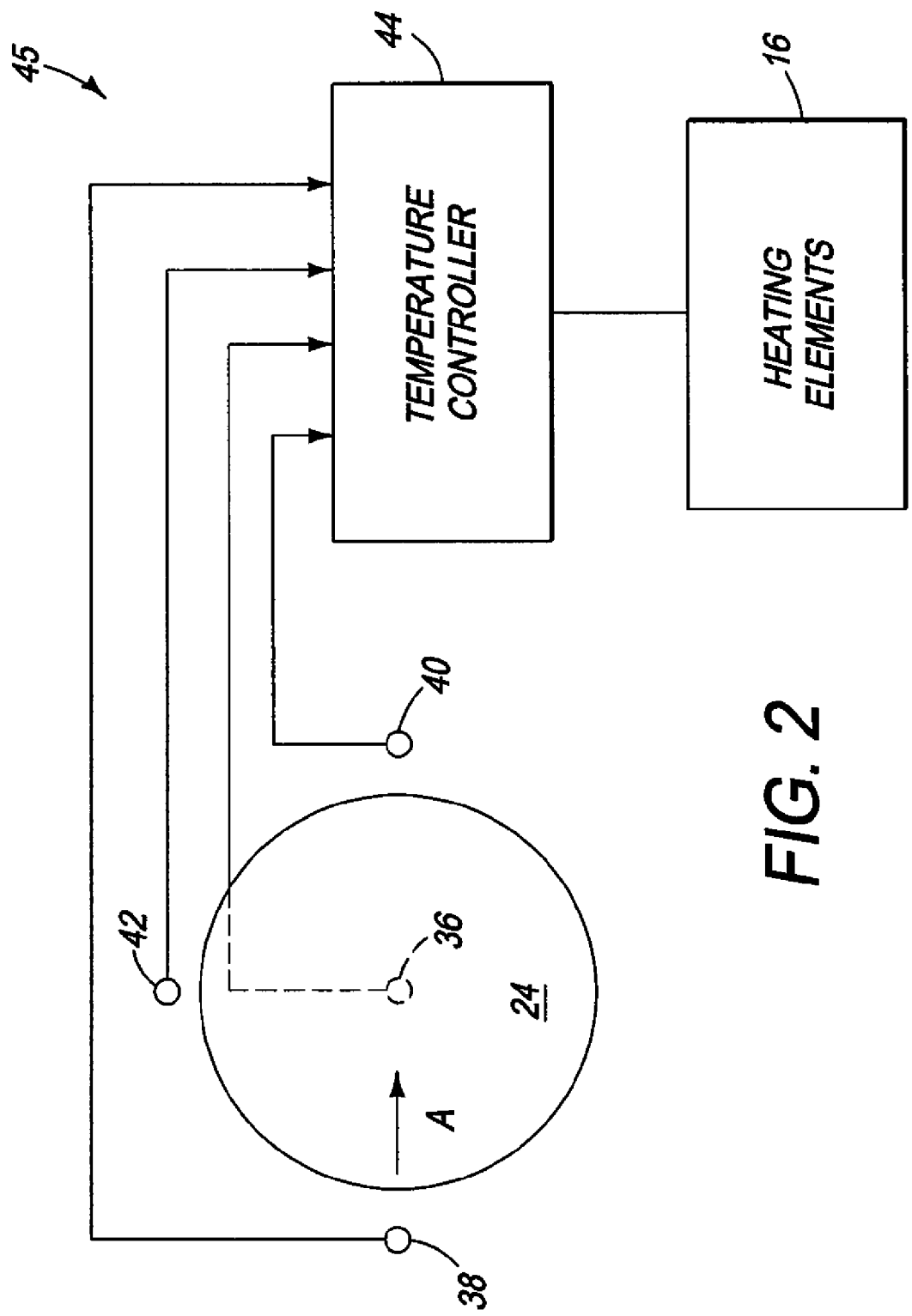
FIG. 2 is a schematic diagram of an embodiment of a temperature control system.

A plurality of temperature sensors are located adjacent to the substrate 24 and the substrate holder 28 for measuring temperatures at locations adjacent the substrate 24, as shown in FIGS. 1-2. In the illustrated embodiment, the temperature sensors include: a central temperature sensor 36 located adjacent to the lower surface of the substrate holder 28, a leading edge temperature sensor 38, a trailing edge temperature sensor 40, and at least one side edge temperature sensor 42. The leading and trailing edge temperature sensors 38, 40 are located adjacent to the front and rear edges of the substrate 24 relative to the direction of flow A of the reactant gases within the reaction space 14. The temperature sensors are configured to measure the temperature in the localized area immediately surrounding the tip of the temperature sensor. A temperature control system 45 for a CVD reactor 10, as shown in FIG. 2, includes a plurality of temperature sensors 36, 38, 40, 42 located adjacent to a substrate 24 being processed, wherein the temperature sensors are operatively connected to a temperature controller 44. The temperature sensors 36, 38, 40, 42 provide temperature data at the particular location to the controller 44. The controller 44 is operatively connected to the heating elements 16 and spot lamps 26. The temperature controller 44 is configured to selectively adjust the energy supplied to the heating element 16 and spot lamps 26 in response to data provided by the temperature sensors to maintain a substantially uniform temperature distribution across the entire substrate 24 being processed. It should be understood by one skilled in the art that the temperature control system 45 may include any number of temperature sensors disposed at different locations for providing data to the controller 44.

Figure 3:
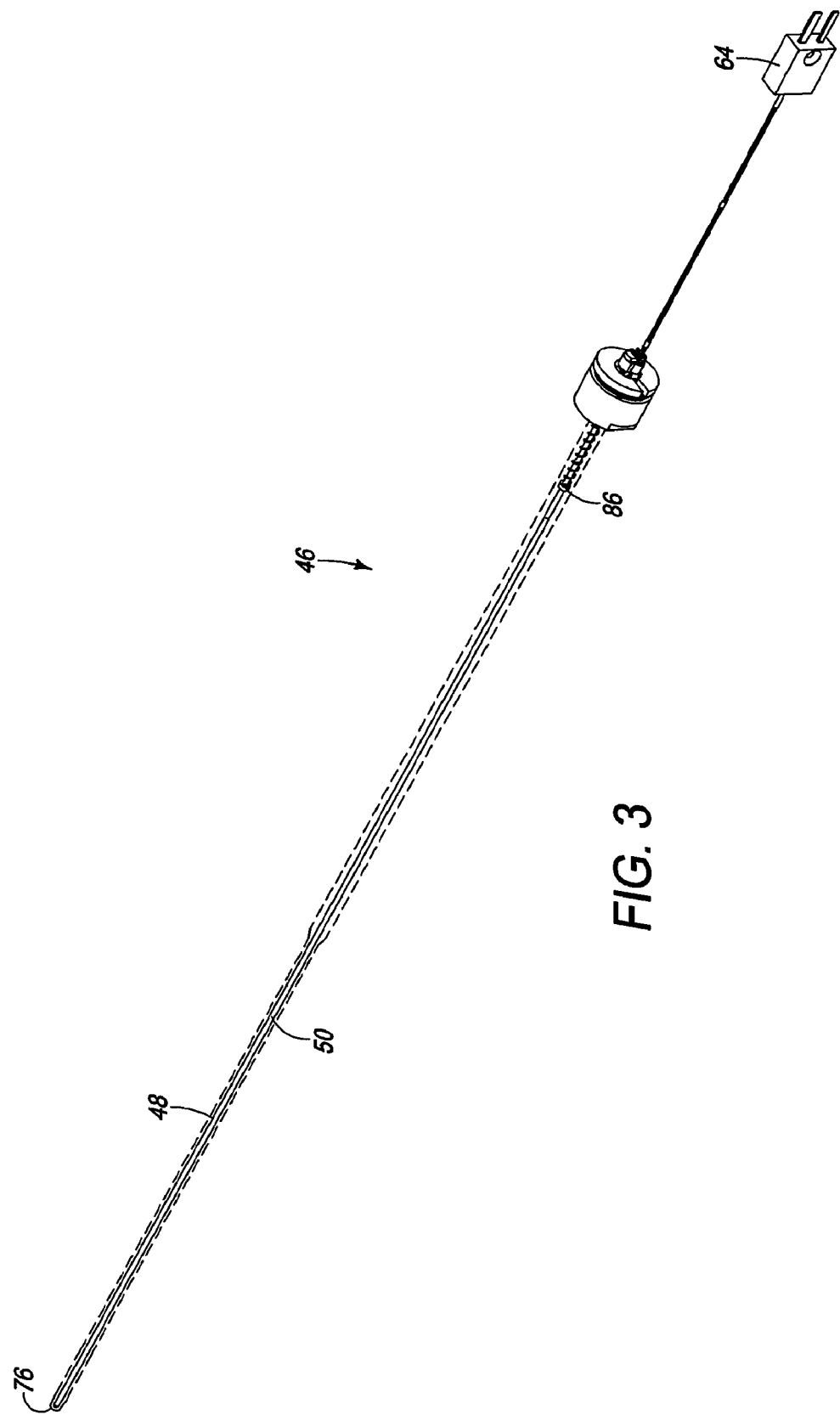
FIG. 3 is an embodiment of a thermocouple of the present invention.
Figure 9:
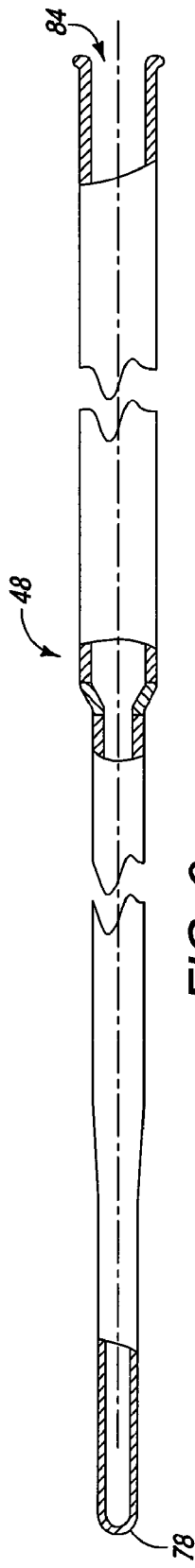
FIG. 9 is a side view of an embodiment of a sheath.
Figure 10:
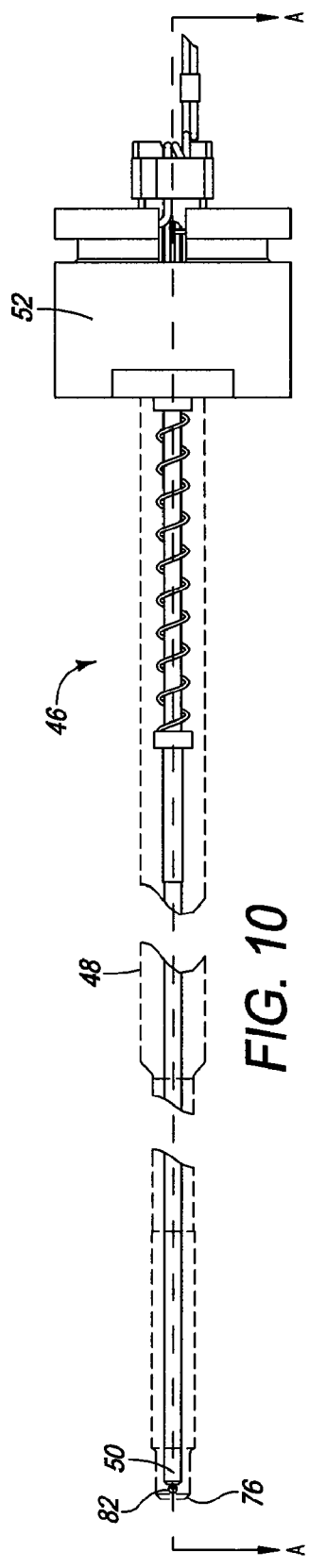
FIG. 10 is a side view of an embodiment of the assembled thermocouple of FIG. 3.
Figure 11:
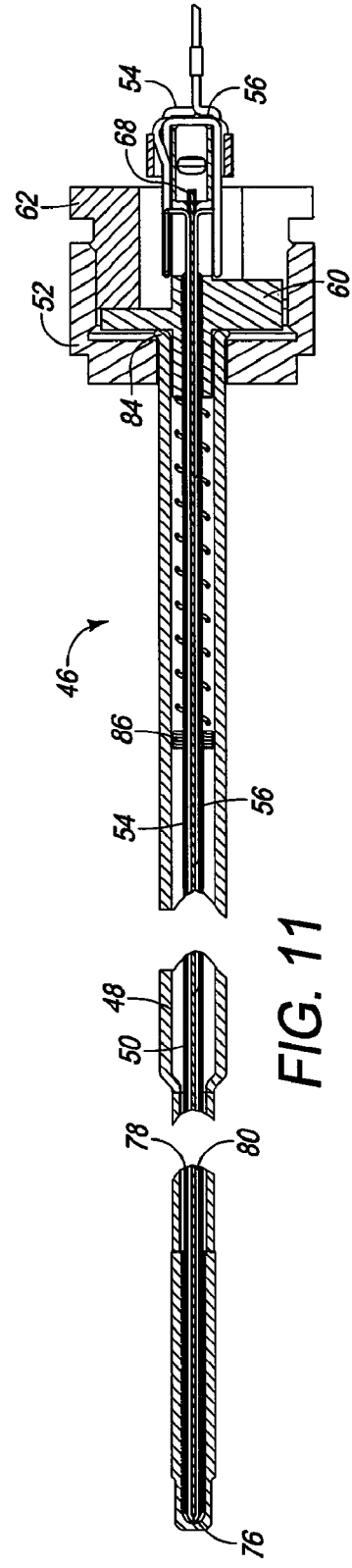
FIG. 11 is a cross-sectional view of the thermocouple of FIG. 10.

In an embodiment, at least one of the temperature sensors 36, 38, 40, 42 is a thermocouple 46, as illustrated in FIGS. 3-15. It should be understood by one skilled in the art that the other temperature sensors 36, 38, 40, 42 may be formed as optical pyrometers, thermocouples previously known in the art, and any combination thereof. In an embodiment, the thermocouple 46, as shown in FIGS. 3-5, includes a sheath 48, a support member 50, a first retainer 52, a first wire 54, a second wire 56, a spring 58, a spacing member 60, a second retainer 62, and a plug 64. In an embodiment, the support member 50 is a generally elongated, cylindrical member having a longitudinal axis B, as illustrated in FIGS. 5-8. The support member 50 includes a first distal end 66 and an opposing second distal end 68. The support member 50 has a generally circular cross-section extending along nearly the entire length of the support member 50 from the first distal end 66. In an embodiment, the support member 50 is tapered to a substantially rectangular cross-section (FIG. 8) near the second distal end 68. In particular, the support member 50 includes a pair of cut-outs 70 formed on opposing sides of the support member 50 in which each cut-out 70 includes a curved portion 72 extending from the outer surface of the support member 50 toward the longitudinal axis B thereof, as shown in FIG. 6. Each cut-out 70 further includes a substantially planar surface 74 extending from the curved portion 72 to the second distal end 68. In an alternative embodiment, the cut-outs 70 are formed as substantially linear tapers, wherein the entire tapered surfaces are substantially planar. The cut-outs 70 allow the first and second wires 54, 56 to remain in a spaced-apart relationship in which the first and second wires 54, 56 are separated by the substantially rectangular-shaped cross-sectional portion of the support member 50, as shown in FIG. 11. It should be understood by one skilled in the art that the cut-outs 70 can be formed of any shape, provided the first and second wires 54, 56 remain separated by at least a portion of the support member 50.

In another embodiment, the support member 50 has a substantially circular cross-sectional shape between the first and second distal ends 66, 68, wherein the support member 50 does not include cut-outs. In another embodiment, the cross-sectional shape of the support member 50 is square. In yet another embodiment, the cross-sectional shape of the support member 50 is oval. It should be understood by one skilled in the art that the cross-sectional shape of the support member 50 may be formed as any shape.

In an embodiment, the support member 50 is formed of ceramic. It should be understood by one skilled in the art that the support member 50 may be formed of any type of material sufficient to withstand the cyclic temperature variations as well as the range of temperatures to which the thermocouple 46 is exposed. It should also be understood by one skilled in the art that although the illustrated thermocouple 46 is substantially linear, the thermocouple 46 may be formed of any shape sufficient to allow the measuring tip 76 of the thermocouple 46 to be disposed at a desired location for a localized temperature measurement.

In an embodiment, the support member 50 further includes a first bore 78 and a second bore 80, as shown in FIGS. 7-8. The first and second bores 78, 80 are formed in the first distal end 66 and extend substantially parallel to the longitudinal axis B through the support member 50. The first and second bores 78, 80 extend the entire length of the support member 50 between the first distal end 66 and the second distal end 68. The first bore 78 is configured to receive the first wire 54, and the second bore 80 is configured to receive the second wire 56. It should be understood by one skilled in the art that additional bores may be formed along the length of the support member 50 for receiving additional wires, allow air circulation therein, or any combination thereof. In another embodiment, the first and second bores 78, 80 extend from the first distal end 66 in a substantially parallel manner relative to the longitudinal axis B of the support member 50, but the exit openings of the first and second bores 78, 80 are spaced from the second distal end 68. The exit openings of the first and second bores 78, 80 are formed on the curved portions 72 of the cut-outs 70.

The support member 50 is at least partially disposed within a protective sheath 48, as shown in FIGS. 4 and 9-11. In an embodiment, the sheath 48 is formed of a transparent quartz material. It should be understood by one skilled in the art that the sheath 48 may be formed of any material sufficient to transmit heat from the environment immediately surrounding the measuring tip 76 through the sheath 48 for providing a temperature reading while being substantially non-reactant relative to the gases introduced into the reaction space 14 of the reaction chamber 12 (FIG. 1). The transparent quartz material allows a substantial amount of radiant energy from the substrate support mechanism 18 to pass therethrough without a detrimental increase in temperature of the sheath 48. By not absorbing a significant amount of the radiant energy from the heating elements 16 or the spot lamps 26, the thermocouple 46 formed between the first and second wires 54, 56 is able to provide an accurate temperature measurement. The sheath 48 has the same general cross-sectional shape as the support member 50 disposed therewithin, but the sheath 48 is slightly larger to provide a small gap between the inner surface of the sheath 48 and the outer surface of the support member 50. The measuring tip 76 forms one distal end of the sheath 48, and an opening 84 is formed at the opposing distal end opposite the measuring tip 76. In an embodiment, the sheath 48 may be coated with silicon nitride (SiN) or have other surface treatments applied thereto to extend the life of the sheath. In another embodiment, a cap (not shown), such as a silicon-carbide (SiC) cap, is applied at the measuring tip 76 of the sheath to provide better heat transfer between the ambient environment and the junction 82 formed between the first and second wires 54, 56.

In an embodiment, the first and second wires 54, 56 extend beyond the first distal end 66 of the support member 50, as shown in FIG. 5. The ends of the first and second wires 54, 56 extending beyond the first distal end 66 are fused together to form an electrical connection therebetween. In an embodiment, the ends of the wires 54, 56 are melted together. It should be understood by one skilled in the art that any method of fusing the ends of the first and second wires 54, 56 to provide an electrical connection therebetween can be used. The bonded wires form a junction 82 located immediately adjacent to the first distal end 66 of the support member 50. The free ends of the first and second wires 54, 56 opposite the junction 82 extend from the second distal end 68 of the support member 50. The first and second wires 54, 56 are formed of dissimilar metals to form a thermocouple therebetween. In an embodiment, the first wire 54 is formed of platinum, and the second wire 56 is formed of a Platinum alloy having 13% Rhodium. It should be understood by one skilled in the art that the first and second wires 54, 56 can be formed of any dissimilar metals sufficient to form a thermocouple therebetween. The junction 82 of the first and second wires 54, 56 is disposed immediately adjacent to inner surface of the sheath 48 at the measuring tip 76. In an embodiment, the junction 82 is in contact with the inner surface of the sheath 48 at the measuring tip 76. In another embodiment, the junction 82 is spaced-apart from the inner surface of the sheath at the measuring tip 76. It should be understood by one skilled in the art that the greater the distance that the junction 82 is spaced from the measuring tip 76 and the particular location to be measured, the less accurate the temperature measurement becomes.

In an embodiment, the diameter of the first and second wires 54, 56 are about 0.010 inches. In another embodiment, the diameter of the first and second wires is about 0.014 inches. It should be understood by one skilled in the art that the first and second wires 54, 56 can be formed of any diameter. It should also be understood by one skilled in the art that the diameter of the first and second wires 54, 56 may have a different diameter. The first and second bores 78, 80 are shaped to receive the first and second wires 54, 56, respectively. The first and second bores 78, 80 are configured to allow the first and second wires 54, 56 to expand radially and axially therewithin. Accordingly, first and second bores 78, 80 have a cross-section that is larger than the cross-section of the first and second wires 54, 56 received therein.

The first and second wires 54, 56 extend from the junction 82, through the spaced-apart bores 78, 80 formed in the support member 50, and exit the first and second bores 78, 80 adjacent to the second distal end 68 of the support member 50, as shown in FIG. 11. The second distal end 68 of the support member 50 extends outwardly beyond the opening 84 of the sheath 48. As shown in FIGS. 4 and 11, a collar 86 is operatively connected to the outer surface of the support member 50 at a spaced-apart distance from the second distal end 68 of the support member 50. In an embodiment, the collar 86 are formed separately from the support member 50 and later fixedly attached to the support member 50. In another embodiment, the support member 50 and the collar 86 are formed as a single member. In an embodiment, at least a portion of the collar 86 contacts the inner surface of the sheath 48 to ensure that the support member 50 is secured within the sheath 48 to prevent substantial movement of the support member 50 therewithin.

A first retainer 52, as shown in FIGS. 4, 10-11, and 12A-12B, is configured to surround a portion of the sheath 48. The first retainer 52 is a substantially hollow cylindrical member having a first end 88 and a second end 90. In an embodiment, the first retainer 52 is formed of Delrin®. In another embodiment, the first retainer 52 is formed of a ceramic material. In yet another embodiment, the first retainer 52 is formed of an injection molded plastic. The first retainer 52 includes a first aperture 92 formed through the first end 88. The first retainer 52 also includes a recessed area 94 configured to receive the sheath 48, spacing member 60, and second retainer 62, as shown in FIG. 11. During assembly, the length of the sheath 48 is inserted through the recessed area 94 in the second end 90 of the first retainer 52 until the ridge forming the opening 84 of the sheath 48 is in an abutting relationship with the inner surface of the recessed area 94 surrounding the first aperture 92. In an embodiment, the first retainer 52 further includes a pair of notches 96 formed in the first end 88. The notches 96 allow the thermocouple 46 to be positively located within a CVD reactor 10.

The spacing member 60, as shown in FIGS. 4, 11, and 13A-13B, is configured to receive the second distal end 68 of the support member 50 and the first and second wires 54, 56. When the thermocouple 46 is assembled, the spacing member 60 is disposed between the first retainer 52 and the second retainer 62. In an embodiment, the spacing member 60 is formed of Delrin®. It should be understood by one skilled in the art that the spacing member 60 can be formed of any material including, but not limited to, plastic, metal, or quartz. In an embodiment, the spacing member 60 includes a base 100, a first protruding portion 102, and a second protruding portion 104, as shown in FIGS. 13A-13B. The base 100 includes a first surface 106 and an opposing second surface 108. The first protruding portion 102 extends from the first surface 106 of the base 100, and the second protruding portion 104 extends from the second surface 108 of the base 100. In an embodiment, the first and second surfaces 106, 108 are substantially flat and oriented in a substantially parallel manner relative to each other. The first surface 106 is configured to be located immediately adjacent to the surface of the recessed area 94 (FIG. 12B) surrounding the first aperture 92 of the first retainer 52.

Figure 15:
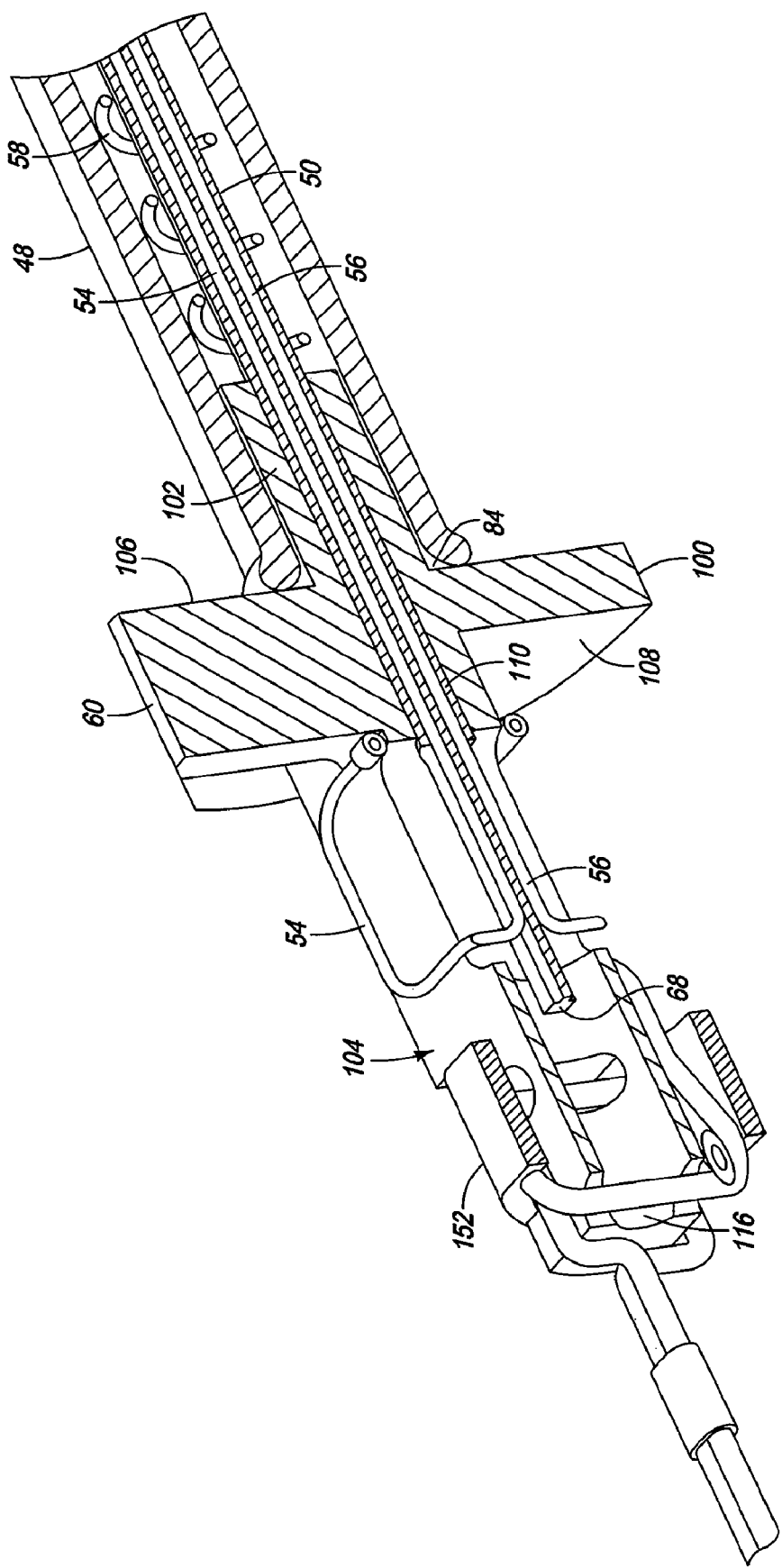
FIG. 15 is a cross-sectional view of a portion of the assembled thermocouple of FIG. 3.

In an embodiment, the first protruding portion 102 of the spacing member 60 includes a first aperture 110 formed therethrough, as shown in FIG. 13B. The first protruding portion 102 is configured to be inserted into the opening 84 of the sheath 48 such that the first aperture 110 receives the portion of the support member 50 adjacent to the second distal end 68 thereof, as illustrated in FIG. 11. In an embodiment the first aperture 110 is sized and shaped to provide a friction, or interference, fit with the outer surface of the support member 50 such that the spacing member 60 is secured to the support member 50. In another embodiment, the first aperture 110 is sized and shaped to allow the support member 50 received therein to freely translate within the first aperture 110, thereby preventing additional compression or tension stresses during thermal expansion or contraction of the support member 50. The outer surface of the first protruding portion 102, is sized to be received in the opening 84 of the sheath 48, as shown in FIG. 15. In an embodiment, the first protruding portion 102 is sized and shaped to allow the spacing member 60 to freely translate within the opening 84 of the sheath 48. In another embodiment, the first protruding portion 102 is sized and shaped to provide an interference, or friction fit between the spacing member 60 and the sheath 48, thereby securing the spacing member 60 to the sheath 48. In an embodiment, the first protruding portion 102 is shaped as a hollow, substantially cylindrical member. However, it should be understood by one skilled in the art that the cross-sectional shape of the first protruding portion 102 should correspond to the cross-sectional shape of the inner surface of the sheath 48 adjacent to the opening 84. In an embodiment, the first aperture 110 extends through the length of the first protruding portion 102, through the base 100, and through a portion of the second protruding portion 104 in a substantially linear manner, as shown in FIGS. 13A-13B. The cross-sectional shape of the first aperture 110 is configured to be substantially the same cross-sectional shape as the portion of the support member 50 received therein.

The second protruding portion 104 extends from the second surface 108 of the base 100, as shown in FIGS. 13A-13B. The second protruding portion 104 is an elongated member having a flattened, elongated cross-sectional shape. The second protruding portion 104 includes a body 114, a second aperture 116, a third aperture 118, a first securing recess 120, a second securing recess 122, a first guide 124, and a second guide 126. The body 114 includes a first side surface 128, an opposing second side surface 130, and a first and second opposing end surfaces 132, 134 that extend between the first and second side surfaces 128, 130. In an embodiment, the first and second side surfaces 128, 130 are formed as substantially parallel, planar surfaces. It should be understood by one skilled in the art that the first and second side surfaces 128, 130 can be planar, ridged, concave, convex, or any other shape. In an embodiment, the first and second end surfaces 132, 134 are formed as curved, or rounded, surfaces extending between the first and second side surfaces 128, 130. It should be understood by one skilled in the art that the first and second end surfaces 132, 134 can be formed as planar surfaces, convex surfaces, concave surfaces, or have any other shape.

A portion of the first aperture 110 is formed through the length of the second protruding portion 104, and a second aperture 116 is formed between the first and second side surfaces 128, 130 of the body 114 of the second protruding portion 104 in a transverse manner relative to the first aperture 110, as shown in FIGS. 13A-13B and 15. The first aperture 110 and the second aperture 116 intersect in a substantially perpendicular manner, thereby providing a window, or gap through the thickness of the body 114 of the second protruding portion 104. In an embodiment, the second aperture 116 is an elongated slot formed through the thickness of the second protruding portion 104. It should be understood by one skilled in the art that the second aperture 116 can be formed as any shape through the thickness of the second protruding portion 104.

The second protruding portion 104 further includes a third aperture 118 formed therethrough in a substantially parallel manner relative to the first aperture 110, as illustrated in FIGS. 13A-13B and 15. The first and third apertures 110, 118 are substantially aligned along the longitudinal axis of the spacing member 60. In an embodiment, the cross-section of the third aperture 118 is elongated and corresponds to the cross-section of the second distal end 68 of the support member 50 such that the third aperture 118 of the spacing member 60 receives the second distal end 68 of the support member 50 and the elongated shape prevents rotation of the support member 50 relative to the spacing member 60. In another embodiment, the cross-section of the third aperture 118 is circular to receive the second distal end 68 of the support member 50 such that the orientation of the spacing member 60 relative to the support member 50 can be adjustable. It should be understood by one skilled in the art that the cross-section of the third aperture 118 of the spacing member 60 should be configured to receive the second distal end 68 of the support member 50. In an embodiment, the third aperture 118 is sized and shaped to receive the second distal end 68 of the support member 50 in an interference, or friction fit, thereby securing the spacing member 60 to the support member 50. In another embodiment, the third aperture 118 is sized and shaped to receive the second distal end 68 of the support member 50 such that the support member 50 can freely translate within the third aperture 118 during thermal expansion of the support member 50.

Figure 16:
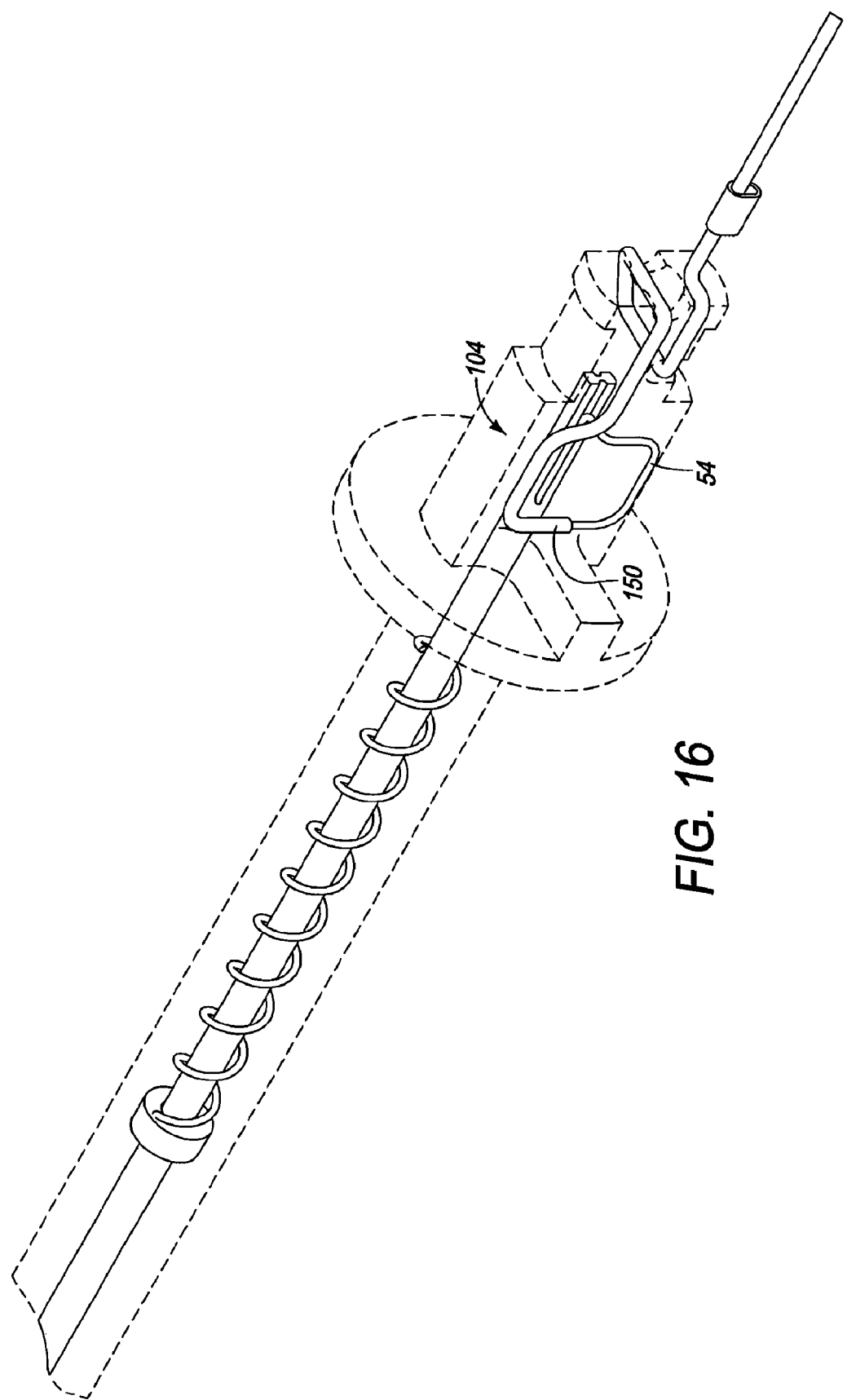
FIG. 16 is an embodiment of a wire pattern for a first wire about a spacing member.

The first and second securing recesses 120, 122 form recessed regions extending radially inward from the first and second end surfaces 132, 134, respectively, of the second protruding portion 104, as shown in FIG. 13A. The first and second securing recesses 120, 122 are configured to receive the first and second wires 54, 56 when assembled, as illustrated in FIGS. 15-17. The first guide 124 is a recessed region formed into the thickness of the body 114 of the second protruding portion 104 from the second securing recess 122. The first guide 124 is configured to receive the first wire 54, as shown in FIG. 16. The first guide 124 is oriented in a substantially parallel manner relative to the second aperture 116. The second guide 126 is a recessed region formed into the thickness of the body 114 from the end 136 of the second protruding portion 104. The second guide 126 is oriented in a substantially parallel manner relative to the second aperture 116. The second guide 126 intersects, or passes through, the third aperture 118 in a substantially perpendicular manner. The second guide 126 is configured to receive the first and second wires 54, 56, as illustrated in FIGS. 16-17.

In an embodiment, a locating member 109 extends from the second surface 108 of the spacing member 60 and is received by a corresponding notch or recess 112 (FIG. 14A) formed in the second retainer 62, thereby allowing the spacing member 60 to be positively located relative to the second retainer 62. The locating member 109 is received in the notch 112 to prevent rotation of the spacing member 60 relative to the second retainer 62. In yet another embodiment, the locating member 109 extends from the first surface 106 and is received by a corresponding notch or recess (not shown) formed in the first retainer 52, thereby allowing the spacing member 60 to be positively located relative to the first retainer 52.

The spacing member 60 is secured between the first retainer 52 and the second retainer 62, as illustrated in FIG. 11. The second retainer 62, as shown in FIGS. 14A-14B is a substantially cylindrical member having a flange 138 and a body 140 extending from the flange 138. The second retainer 62 includes a first end surface 142 and a second end surface 144. The second retainer 62 is formed as a substantially cylindrical member, wherein the second securing member has an aperture 146 extending along the longitudinal axis thereof. The second retainer 62 also includes a notch 112 formed through the radial thickness of the flange 138 and the body 140. The notch 112 is configured to receive the locating member 109 extending from the second surface 108 of the base 100 of the spacing member 60. When the locating member 109 is received in the notch 112, the spacing member 60 and the second retainer 62 are operatively connected such that the spacing member 60 does not rotate relative to the second retainer 62. The aperture 146 of the second retainer 62 is configured to receive the second protruding portion 104 of the spacing member 60, as shown in FIG. 11, such that a portion of the second protruding portion 104 of the spacing member 60 extends longitudinally beyond the second end surface 144 of the second retainer 62. Further, the first end surface 142 of the second retainer 62 is configured to be in an abutting relationship with the second surface of the base 100 of the spacing member 60 and the flange 138 of the second retainer 62 is configured to be in an abutting relationship with the second end 90 of the first retainer 52.

Assembly of the thermocouple 46 includes inserting the first wire 54 through the first bore 78 adjacent the second distal end 68 of the support member 50 and inserting the second wire 56 through the second bore 80 adjacent the second distal end 68 of the support member 50. It should be understood by one skilled in the art that the first and second wires 54, 56 can be inserted into the first and second bores 78, 80, respectively, at the first distal end 66 of the support member 50. The first and second wires 54, 56 are threaded through the first and second bores 78, 80 such that a portion of the first and second wires 54, 56 extend beyond the first distal end 66 of the support member 50. The exposed ends of the first and second wires 54, 56 adjacent the first distal end 66 of the support member 50 are then fused together to form a junction 82. The support member 50 with the first and second wires 54, 56 disposed therein is inserted into the sheath 48 such that the junction 82 is in contact with the inner surface of the sheath 48 at the measuring tip 76. It should be understood by one skilled in the art that the junction 82 can also be spaced apart from the inner surface of the sheath 48.

Once the support member 50 is disposed within the sheath 48 such that the second distal end 68 of the support member 50 extends beyond the opening 84 of the sheath 48, the spacing member 60 is secured to the sheath 48. The first protruding portion 102 of the spacing member 60 is inserted into the opening 84 of the sheath 48 such that the second distal end 68 of the support member 50 is received in the first and third apertures 110, 118 of the spacing member 60. The first surface 106 of the base 100 of the spacing member 60 contacts the surface surrounding the opening 84 of the sheath 48. The spacing member 60 is operatively connected to the sheath 48 such that the spacing member remains secured to the sheath 48 during the cyclical temperature changes due to processing in the CVD chamber 10. Because the spacing member 60 is secured to the sheath 48, the support member 50 is free to translate radially and along the longitudinal axis within the first and third apertures 110, 118. Allowing the support member 50 to move freely within the first and third apertures 110, 118 prevents tension and compression forces to be introduced into the support member 50 during thermal expansion or contraction thereof.

As shown in FIGS. 15-17, the first and second wires 54, 56 exit the first and second bores 78, 80, respectively, within the second aperture 116 of the spacing member 60. While the first and second wires 54, 56 remain separated by the support member 50 within the second aperture 116, the first and second wires 54, 56 are wound in a pattern about the spacing member 60. A Teflon® tube 150 is slid over both the first and second wires 54, 56 to prevent the wires from contacting each other and causing a short circuit therebetween. In an embodiment, as shown in FIGS. 15-16, the first wire 54 exits the second aperture 116 near the end adjacent to the second distal end 68 of the support member 50. The first wire 54 extends along the first side surface 128 of the spacing member 60 adjacent to the second aperture 116, wherein the first wire 54 forms a generally U-shaped pattern along the first side surface 128. The first wire 54 then extends along the first side surface 128 adjacent to the end of the second aperture 116 toward the end 136 of the second protruding portion 104. The first wire 54 is then disposed within the second guide 126, extending from the first side surface 128 to the second side surface 130. The first wire 54 then extends adjacent to the second side surface 130 from the second guide 126 to the first guide 124. The first wire 54 extends through the first guide 124 from the second side surface 130 to the first side surface 128, then the first wire 54 extends along the first side surface 128 from the first guide 124 toward the end 136 of the second protruding portion 104. The first wire 54 extends away from the spacing member 60 from the end 136.

In an embodiment, as shown in FIGS. 15 and 17, the second wire 56 exits the second aperture 116 near the end adjacent to the second distal end 68 of the support member 50. The second wire 56 exits the second aperture 116 in a direction opposite the direction from which the first wire 54 exits the second aperture 116. The second wire 56 extends along the second side surface 130 of the spacing member 60 adjacent to the second aperture 116, wherein the second wire 56 forms a generally U-shaped pattern along the second side surface 130. The second wire 56 then extends along the second side surface 130 adjacent to the end of the second aperture 116 toward the end 136 of the second protruding portion 104. The second wire 56 is then disposed within the second guide 126, extending from the second side surface 130 to the first side surface 128. The second wire 56 then extends adjacent to the first side surface 128 from the second guide 126 to the first guide 124. The second wire 56 extends through the first guide 124 from the first side surface 128 to the second side surface 130, then the second wire 56 extends along the second side surface 130 from the first guide 124 toward the end 136 of the second protruding portion 104. The second wire 56 extends away from the spacing member 60 from the end 136 along with the first wire 54. Once the first and second wires 54, 56 are located about the spacing member 60, a shrink sleeve 152 (FIG. 15) is disposed about the first securing recess 120 and second securing recess 122 to secure the first and second wires 54, 56 to the spacing member 60. It should be understood by one skilled in the art that a portion of the first and second wires 54, 56 are bare, or uncovered, within the second aperture 116 of the spacing member 60, but the Teflon® tubes 150 covering the wires as they exit the second aperture 116 protect the wires during transport, installation, and in operation.

Once the first and second wires 54, 56 are disposed about the spacing member 60, the sheath 48, support member 50, and spacing member 60 are then inserted through the first aperture 92 of the first retainer 52 until the flange defining the opening 84 of the sheath 48 contacts the surface of the recessed area 94 surrounding the first aperture 92 of the first retainer 52. In an embodiment, the first aperture 92 of the first retainer 52 is shaped to allow the first surface 106 of the base 100 of the spacing member 60 to contact the surface of the recessed area 94 surrounding the first aperture 92 of the first retainer 52 in an abutting manner. In another embodiment, the first surface 106 of the spacing member 60 is spaced apart from the surface of the recessed area 94 surrounding the first aperture 92 of the first retainer 52.

After the sheath 48, support member 50, and spacing member 60 are disposed within the first retainer 52, the second retainer 62 is disposed over the second protruding portion 104 of the spacing member 60 such that the second protruding portion 104 is received within the aperture 146 formed in the second retainer 62. The end 136 of the second protruding portion 104 of the spacing member 60 extends beyond the second end surface 144 of the second retainer 62. The notch 112 formed in the second retainer 62 receives the locating member 109 of the spacing member 60 to positively locate the spacing member 60 relative to the second retainer 62. When assembled, the first end surface 142 of the second retainer 62 is in an abutting relationship with the second surface 108 of the base 100 of the spacing member 60, wherein the body 140 of the second retainer 62 is disposed within the recessed area 94 of the first retainer 52. In an embodiment, the second retainer 62 is fixedly attached to the first retainer 52 by glue or any other means of securing the first and second retainers 52, 62 to prevent rotation therebetween. In another embodiment, the second retainer 62 is removably connected to the first retainer 52. The first and second wires 54, 56 covered by the Teflon® tubes 150 extend from the second retainer 62 and are operatively connected to the plug 64 to complete the assembly of the thermocouple 46.

The thermocouple 46 may be used as a central temperature sensor 36 or it may be used as a leading edge temperature sensor 38, trailing edge temperature sensor 40, or side edge temperature sensor 42, as illustrated in FIG. 2. When the thermocouple 46 is employed as a central temperature sensor 36 (FIG. 1), the measuring tip 76 is disposed within a recessed formed in the lower surface of the substrate holder 28. At this location, the measuring tip 76 of the thermocouple 46 is configured to measure the temperature of the substrate holder 28 immediately adjacent thereto. During operation of the CVD reactor 10, the temperature within the reaction chamber 12 often cycles between significantly high and low temperatures. For example, the temperature within the reaction chamber may be between room temperature and about 1200° C. or more. The coefficient of thermal expansion of the support member is different than the coefficient of thermal expansion of the first and second wires. Historically, the first and second wires were secured together and to the second distal end of the support member through which the wires extended. Because the difference between the coefficients of thermal expansion and temperatures of the wires and the support member, the wires and support member would expand and contract at different rates as the temperatures within the CVD reactor 10 increased or decreased. Prolonged exposure to these cyclical temperatures in which the wires were not free to thermally expand or contract freely with respect to the support member caused grain slip in the wires, resulting in failure of the thermocouple. The present design allows the wires to freely expand in the longitudinal direction relative to the support member, thereby reducing the potential stress or strain in the wires during thermal expansion or contraction.

The first and second wires 54, 56 are formed of different metals and accordingly have different coefficients of thermal expansion. Likewise, the support member 50 is formed of a different material such that the support member 50 has a different coefficient of thermal expansion relative to the first and second wires 54, 56. Because each of these members have a different coefficient of thermal expansion, each of them will expand and contract differently in response to the same temperature change. The spacing member 60 allows the first and second wires 54, 56 to independently thermally expand relative to each other. The spacing member 60 also allows the support member 50 to independently thermally expand relative to the first and second wires 54, 56.

The spacing member 60 is removeably attached to the sheath 48 such that the spacing member 60 remains fixedly attached to the sheath 48 during operation of the thermocouple 46, but the spacing member 60 is removable from the sheath 48 to allow for refurbishment or disassembly of the thermocouple 46. The support member 50 is received in the substantially aligned first and third apertures 110, 118 of the spacing member 60 such that the support member 50 is allowed to expand radially and in a longitudinal manner in response to thermal expansion. Because the support member 50 can freely expand due to the temperature changes to which the thermocouple 46 is exposed, there are no compression or tension stresses introduced into the support member 50 that would otherwise be introduced if the support member 50 were secured to the sheath 48. In addition, the first and second wires 54, 56 are likewise allowed to freely expand radially and along their longitudinal axes within the support member 50 and about the spacing member 60. The second aperture 116 of the spacing member 60 maintains the first and second wires 54, 56 in a spaced-apart relationship to prevent a short circuit, but the second aperture 116 also allows the first and second wires 54, 56 to thermally expand at a different rate than the support member 50. Because the coefficient of thermal expansion of the first and second wires 54, 56 is different than the support member 50, the first and second wires 54, 56 should be allowed sufficient space to expand and contract at a different rate than the support member 50 due to thermal changes to both.

The second aperture 116 of the spacing member 60 allows the first and second wires 54, 56 to thermally expand and contract at a different rate relative to the support member 50. The first and second wires 54, 56 exit the first and second bores 78, 80, respectively, of the support member 50 within the second aperture 116. The first and second wires 54, 56 exit the second aperture 116 and form a U-shaped loop adjacent to the opposing side surface of the spacing member 60. The pattern formed by the first and second wires 54, 56 as they exit the bores 78, 80 allow the wires to expand longitudinally at a different rate than the support member 50, thereby preventing grain slip along the wires and also preventing compression or tension stresses from being introduced into the first and second wires 54, 56.

While preferred embodiments of the present invention have been described, it should be understood that the present invention is not so limited and modifications may be made without departing from the present invention. The scope of the present invention is defined by the appended claims, and all devices, process, and methods that come within the meaning of the claims, either literally or by equivalence, are intended to be embraced therein.

What is claimed is:

1. A thermocouple for measuring a temperature within a reaction chamber comprising:
   a sheath having a measuring tip and an opening;
   a support member having a first distal end and an opposing a second distal end;
   a first wire received within said support member;
   a second wire received within said support member, said second wire being spaced-apart from said first wire within said support member; and
   a spacing member attached to the sheath, the spacing member comprising a base comprising:
   a first portion; and
   a second portion opposite the first portion;
   wherein the first portion includes a first aperture configured to receive the support member and allow the support member to independently thermally expand and contract relative to the first wire and he second wire; and
   wherein the second portion includes a second aperture configured to receive the first wire and the second wire, the second aperture configured to allow the first wire, the second wire, and the support member to independently thermally expand and contract relative to each other.

2. The thermocouple of claim 1, wherein said sheath is formed of quartz.

3. The thermocouple of claim 1, wherein said support member is formed of ceramic.

4. The thermocouple of claim 1, wherein said first wire is formed of platinum, and said second wire is formed of a Platinum alloy containing about 13% Rhodium.

5. The thermocouple of claim 1, wherein said spacing member includes a base, a first protruding portion extending from said base, and a second protruding portion extending from said base, said first protruding portion receivable in said opening of said sheath.

6. The thermocouple of claim 1, wherein said spacing member maintains said first wire and said second wire in a spaced-apart relationship.

7. The thermocouple of claim 1, wherein said first wire has a different coefficient of thermal expansion than said second wire.

8. The thermocouple of claim 7, wherein said support member has a different coefficient of thermal expansion than both of said first and second wires.

9. The thermocouple of claim 8, wherein said spacing member allows each of said support member, said first wire, and said second wire to freely thermally expand and contract at a different rate without introducing compression or tension stresses therein.

10. The thermocouple of claim 1, wherein said first and second wire are fused together adjacent to form a junction.

11. The thermocouple of claim 10, wherein said junction is located adjacent to said first distal end of said support member.

12. The thermocouple of claim 10, wherein said junction contacts an inner surface of said sheath at said measuring tip.

13. The thermocouple of claim 1, wherein a first protective tube covers a portion of said first wire, and a second protective tube covers a portion of said second wire.

14. A temperature control system for use in a semiconductor processing reactor, said temperature control system comprising:
   at least one heating element located within said reactor;
   a controller operatively connected to said at least one heating element, said controller configured to control said at least one heating element; and
   at least one temperature sensor located within said reactor, said at least one temperature sensor operatively connected to said controller for providing temperature data to said controller, wherein said at least one temperature sensor includes a thermocouple, said thermocouple comprises:
   a sheath having an opening;
   a support member, a portion of said support member disposed within said sheath;
   a first wire and a second wire formed of dissimilar metals, a portion of said first and second wires received within said support member; and a spacing member attached to the sheath, the spacing member comprising a base that includes:
a first portion; and
a second portion opposite the first portion;
wherein the first portion includes a first aperture configured to receive the support member and allow the support member to independently thermally expand and contract relative to the first wire and he second wire; and
wherein the second portion includes a second aperture configured to receive the first wire and the second wire, the second aperture configured to allow the first wire, the second wire, and the support member to independently thermally expand and contract relative to each other.

15. The temperature control system of claim 14, wherein said spacing member is secured between a first retainer and a second retainer.

16. The temperature control system of claim 14, wherein said first and second wires extend about said spacing member.

17. The temperature control system of claim 16, wherein said first and second wires are secured to said spacing member by a shrink sleeve such that said first and second wires remain free to thermally expand and contract without introducing compression or compression stresses therein.

18. The temperature control system of claim 14, wherein said at least one temperature sensor further includes a second thermocouple operatively connected to said controller.

19. The temperature control system of claim 14, wherein said controller utilizes said temperature data from said at least one temperature sensor to adjust an output of said at least one heating element.

20. The temperature control system of claim 14, wherein said spacing member maintains said first and second wires in a spaced-apart relationship.

21. The temperature control system of claim 14, wherein said spacing member is formed of Delrin®.

22. The temperature control system of claim 14, wherein a first protective tube covers a portion of said first wire, and a second protective tube covers a portion of said second wire.

* * * * *